United States Patent
Behrends et al.

(10) Patent No.: US 9,478,675 B2
(45) Date of Patent: Oct. 25, 2016

(54) METHOD AND APPARATUS FOR LOCALIZING AND QUENCHING AN ARC

(71) Applicant: SMA Solar Technology AG, Niestetal (DE)

(72) Inventors: Holger Behrends, Kassel (DE); Marcel Kratochvil, Kassel (DE); Markus Hopf, Espenau (DE)

(73) Assignee: SMA SOLAR TECHNOLOGY AG, Niestetal (DE)

( * ) Notice: Subject to any disclaimer, the term of this patent is extended or adjusted under 35 U.S.C. 154(b) by 105 days.

(21) Appl. No.: 14/540,214

(22) Filed: Nov. 13, 2014

(65) Prior Publication Data
US 2015/0077884 A1 Mar. 19, 2015

Related U.S. Application Data

(63) Continuation of application No. PCT/EP2013/060243, filed on May 17, 2013.

(30) Foreign Application Priority Data

May 18, 2012 (DE) .................. 10 2012 104 314

(51) Int. Cl.
| H01L 31/042 | (2014.01) |
| H01L 31/02 | (2006.01) |
| H02H 1/00 | (2006.01) |
| H02H 7/20 | (2006.01) |
| H02J 3/38 | (2006.01) |
| G01R 31/12 | (2006.01) |
| H02H 7/26 | (2006.01) |

(52) U.S. Cl.
CPC ...... *H01L 31/02021* (2013.01); *H02H 1/0015* (2013.01); *H02H 7/20* (2013.01); *H02J 3/383* (2013.01); *G01R 31/1227* (2013.01); *H02H 7/261* (2013.01); *Y02E 10/563* (2013.01)

(58) Field of Classification Search
USPC ............................................ 361/42; 136/244
See application file for complete search history.

(56) References Cited

U.S. PATENT DOCUMENTS

| 6,625,550 B1 | 9/2003 | Scott et al. |
| 2011/0267721 A1 | 11/2011 | Chaintreuil et al. |
| 2012/0174961 A1* | 7/2012 | Larson .............. H01L 31/02021 136/246 |

(Continued)

FOREIGN PATENT DOCUMENTS

| DE | 10155795 C1 | 7/2003 |
| DE | 102011000737 A1 | 6/2012 |
| GB | 2348751 A | 10/2000 |

OTHER PUBLICATIONS

International Search Report dated Oct. 7, 2013 for International application No. PCT/EP2013/060243.

*Primary Examiner* — Danny Nguyen
(74) *Attorney, Agent, or Firm* — Eschweiler & Associates, LLC

(57) ABSTRACT

The disclosure relates to a method for localizing and quenching an arc in a PV generator of a PV system, wherein the PV generator includes at least two PV subgenerators. An arc quenching circuit is associated with each PV subgenerator. The method includes detecting an arc in the PV generator. Then, a probability value is determined for each of the PV subgenerators, wherein the probability value is correlated with a probability that the arc is located in the corresponding PV subgenerator. A sequence for activating the arc quenching circuits is then determined that is dependent on the determined probability values. Then, the arc quenching circuits are activated successively in the order of the determined sequence.

19 Claims, 2 Drawing Sheets

(56) References Cited

U.S. PATENT DOCUMENTS

| | | |
|---|---|---|
| 2012/0253533 A1 | 10/2012 | Eizips et al. |
| 2012/0318320 A1 | 12/2012 | Robbins |
| 2013/0015875 A1* | 1/2013 | Kumar .................. H02S 50/10 324/761.01 |
| 2013/0170084 A1 | 7/2013 | Strobl et al. |

* cited by examiner

METHOD AND APPARATUS FOR LOCALIZING AND QUENCHING AN ARC

REFERENCE TO RELATED APPLICATIONS

This application is a continuation of international application number PCT/EP2013/060243, filed on May 17, 2013, which claims priority to German application number 10 2012 104 314.0, filed on May 18, 2012.

FIELD

The disclosure relates to a method and an apparatus for localizing and quenching an arc in a photovoltaic generator, which comprises at least two photovoltaic subgenerators, wherein each photovoltaic subgenerator comprises an arc quenching circuit in the respective photovoltaic subgenerator. The disclosure furthermore relates to a photovoltaic system comprising such an apparatus.

BACKGROUND

In particular, relatively large photovoltaic (PV) systems (photovoltaic is referred to below as PV) can have a PV generator which often comprises a plurality of, but at least two, PV subgenerators connected in parallel. Such a PV subgenerator can be a so-called string, for example, which is formed from a plurality of PV modules connected in series. The PV generator is connected to one or more inverters within the PV system, which inverters convert the direct current (DC) produced by the PV generator into an alternating current (AC) suitable for feeding a power supply system. In such PV systems, isolation between the PV generator and the inverter is generally required. Depending on requirements, this isolation can be a functional disconnection simply via a semiconductor switch, galvanic isolation or even galvanic isolation at all poles. In the case of galvanic isolation or galvanic isolation at all poles, this can be implemented with the aid of electromechanical switches. In this case, a dedicated electromechanical switch is often associated with each of the PV subgenerators in order to be able to selectively disconnect the PV subgenerators, for example in the event of a fault. An electromechanical switch is understood to mean an electromechanically actuated switch, actuated by an electric motor or an electromagnet, for example. Electromagnet-actuated switches are also referred to as relays or contactors.

In PV systems, owing to the high DC voltage and the high prevailing direct currents, arcs represent a problem which should not be underestimated and are one of the primary causes of fires. If an arc is identified, means for quenching the arc in the respective PV subgenerators should be activated as quickly as possible. Such means represent, for example, the mentioned switches for isolating the PV subgenerators from the input of the inverter. If a PV subgenerator is isolated from the inverter, the current through an arc which is connected in series with the PV subgenerator is reduced, as a result of which this arc is quenched. Document DE 10 2011 000 737 A1 discloses, for example, an isolating switch which is activated automatically after detection of an arc as part of a protection device, which is, for example, arranged between a PV generator and an inverter, close to the PV generator.

In particular, in the case of large PV systems, simultaneous decoupling of the entire PV generator, i.e. simultaneous decoupling of all of the PV subgenerators, is disadvantageous since instabilities in the power supply system to which the inverter feeds can occur. In addition, subsequent fault-finding is complex since, in the case of such a simultaneous disconnection of all of the PV subgenerators, it is not possible for the arc to be localized. If, on the other hand, the PV subgenerators are isolated from the DC input circuit of the inverter successively, the location of the arc can be restricted at least to the level of the PV subgenerators. A similar method for localizing an arc is described in document DE 101 55 795 C1 in connection with a motor vehicle power supply system, which comprises a plurality of power supply subsystems.

Owing to the inertia of the electromechanical switches via which the PV subgenerators are connected to the inverter, a single switching operation has a minimum switching duration, however, which can be in the region of a few tens of milliseconds. Added to this is in each case the time which is required for establishing, after a switching operation, whether the previously detected arc still exists or has been quenched. In the case of large PV systems with a correspondingly large number of PV subgenerators, sequential or successive disconnection can take a few seconds under certain circumstances. In the worst case, the arc can be present up until disconnection of the last subgenerator, i.e. throughout the entire time of the switching sequences. This is undesirable for safety reasons, for example owing to the risk of a fire originating from an arc, and, under certain circumstances, for example in accordance with the US standard UL1699B, is also impermissible.

SUMMARY

Therefore, one embodiment of the present disclosure comprises providing a method and a PV system in which an arc in a PV generator with a plurality of PV subgenerators is quenched as quickly as possible and is localized in this process.

A method according to one embodiment of the disclosure of the type mentioned at the outset comprises the following: First an arc is detected in the PV generator. Then, a probability value is determined for each of the PV subgenerators, which probability value is correlated with a probability that the arc is located in the corresponding PV subgenerator. Then, a sequence for activating the arc quenching circuits is determined depending on the determined probability values. Then, the arc quenching circuits are activated successively in the order of this sequence.

According to the disclosure, the arc quenching circuits are not activated in a fixedly predetermined sequence but in a sequence which also takes into consideration the probability with which the arc is located in a specific PV subgenerator. In one embodiment, the quenching attempt is first directed to the PV subgenerator in which there is the highest probability that the arc is located in this PV subgenerator. Then on to the PV subgenerator with the second highest probability etc. In this way, an arc is both quenched and localized within a very short period of time.

In one example configuration of the method, the probability values are determined on the basis of noise levels of AC voltage signals in the PV subgenerators. In one embodiment, the arc quenching circuits are in this case activated in the sequence of decreasing noise level. Arcs emit a broadband AC voltage signal, which is also referred to as a noise signal. Owing to, for example, capacitive and inductive couplings between the PV subgenerators, this AC voltage signal is not restricted to the PV subgenerator in which an arc is present. Direct localization of the arc via this signal is therefore not possible. The level of the AC voltage signal, the noise level, is, however, correlated with the probability that the arc is present in the corresponding PV subgenerator, and can act as a readily measurable variable for establishing the sequence of the activation of the arc quenching circuits in the method according to the disclosure.

In a further example configuration of the method, the probability values are calculated from changes in measured partial currents flowing through the PV subgenerators. The occurrence of an arc is accompanied by a change in the partial current which is flowing through the affected PV subgenerator. A change in current in a PV subgenerator also entails changes in the current in other PV subgenerators, however, owing to the way in which the PV subgenerators are connected to one another to form the entire PV generator. The observed change in a partial current thus does not result in direct localization of an arc. In turn, the change in current can be used, however, to establish the sequence of the activation of the quenching means in the method according to the disclosure.

In a further example configuration of the method, signaling is performed to indicate that an arc is located in a specific PV subgenerator if, after activation of the arc quenching circuit associated with this PV subgenerator, an arc is no longer detected in the PV generator.

In a further example configuration of the method, the probability values are determined on the basis of the noise levels and on the basis of the changes in the measured values for the partial currents. In one embodiment, in this case a check is performed to ascertain whether the change in the partial currents correlates temporally with a change in the noise levels, and a plausibility check of the probability of an arc in the PV subgenerator is implemented depending on this result. The different indicators for the presence of an arc are therefore considered jointly, as a result of which an even higher degree of reliability is achieved for localizing the arc as quickly as possible.

In a further example configuration of the method, upon activation of the arc quenching circuit, a partial current through the corresponding PV subgenerator is interrupted. Alternatively, the corresponding PV subgenerator is short-circuited. Both of these are effective methods for quenching an existing arc. By interrupting the partial current through a PV subgenerator, a series arc flowing in the interrupted circuit is quenched. The short circuit quenches a parallel arc. Both quenching methods can also be combined, for example by being implemented successively.

In one embodiment, in order to interrupt the partial current through the corresponding PV subgenerator, in each case a switching element, each comprising an electromechanical switch and a semiconductor switch arranged in parallel therewith, is used, wherein the interruption of the partial current through the corresponding PV subgenerator is performed by switching of the respective semiconductor switch of the switching element after, first of all, all of the electromechanical switches of the switching elements have been opened. In this way, a plurality of or many PV subgenerators can be checked successively in quick succession for the presence of an arc.

An apparatus according to the disclosure for localizing and quenching an arc in a PV generator of a PV system, which PV generator comprises at least two PV subgenerators, comprises an arc quenching circuit associated with in each case one PV subgenerator and at least one device for arc detection. The apparatus is characterized by the fact that it also comprises a control device per PV subgenerator and/or a central control device. The control device and/or the central control device is configured to determine a probability value for each of the PV subgenerators, which probability value is correlated with a probability that the arc is located in the corresponding PV subgenerator, and to determine a sequence for activating the arc quenching circuits depending on the probability values determined, and to successively activate the arc quenching circuits in the order of the determined sequence. The apparatus is thus configured to implement the abovementioned method. A PV system according to the disclosure comprising a PV generator, which comprises at least two PV subgenerators, comprises such an apparatus. In both cases, the advantages mentioned in connection with the method are provided also, inter alia.

BRIEF DESCRIPTION OF THE DRAWINGS

The disclosure will be explained in more detail below with reference to exemplary embodiments with the aid of two figures, in which.

DETAILED DESCRIPTION

Figure 1:
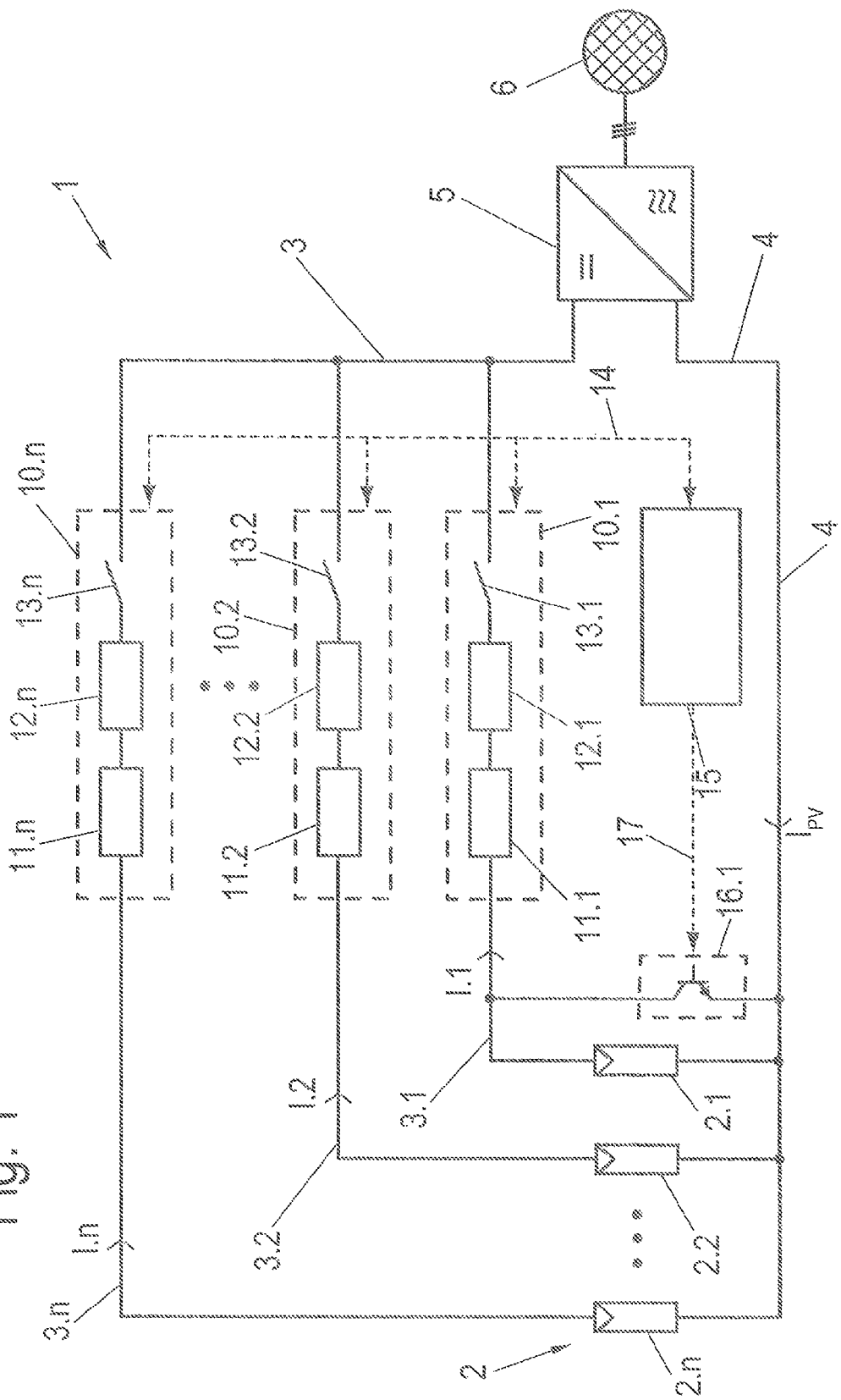
FIG. 1 shows a block circuit diagram of a PV system.

FIG. 1 shows, schematically, a block circuit diagram of the basic design of a PV system 1, within which a method in accordance with the application can be implemented. The PV system 1 comprises a PV generator 2, which comprises a number n, in this case n=3, for example, of PV subgenerators 2.1, 2.2 to 2.n. Each of the PV subgenerators 2.1-2.n can comprise, for example, a string or a parallel circuit of strings, wherein a string represents an arrangement of a plurality of PV modules connected in series. By way of example, the PV subgenerators 2.1-2.n are symbolized by the electronic symbol of an individual photovoltaic cell in the figure.

The PV subgenerators 2.1-2.n are connected to a DC input circuit of an inverter 5 via DC lines 3, 4. On the output side, the inverter 5 is coupled to a power supply system 6 for feeding power.

The power supply system 6 can be a public power supply grid or a private power supply system (stand-alone power supply system). By way of example, the inverter 5 is designed with three AC outputs for a three-phase feed to the power supply system 6. It goes without saying that a different design of the inverter 5 and/or of the power supply system 6 other than the illustrated three-phase design is also possible, for example a single-phase design. In addition, only the parts of the PV system 1 which are essential in the context of the application are illustrated in FIG. 1. Further elements which are arranged on the DC or AC side of the inverter 5, such as further isolating or switching elements, filters, monitoring devices or transformers, for example, are not illustrated for reasons of clarity.

In the example shown, the PV subgenerators 2.1-2.n are connected with one of their connections, in this case the cathode, for example, directly to one another and to the DC line 4. The other connection of said PV subgenerators 2.1-2.n, in this case the anode, in each case leads to a respective monitoring unit 10.1, 10.2 to 10.n via separate current paths 3.1, 3.2 to 3.n. The respective corresponding PV subgenerator 2.1-2.n is then connected to the common DC line 3 and the inverter 5 via the respective monitoring unit 10.1, 10.2 to 10.n.

Each of the monitoring units 10.1, 10.2-10.n comprises a current measurement circuit or arrangement 11.1, 11.2-11.n, a device 12.1, 12.2-12.n for arc detection and a switching element 13.1, 13.2-13.n.

The current measurement arrangements 11.1-11.*n* serve to determine a respective partial current I.1-I.n, which is flowing through the corresponding current path 3.1-3.*n* and therefore through the PV subgenerator 2.1-2.*n*. Said current measurement arrangements have, for example, in each case a current measuring resistor (shunt), at which a voltage drop occurs during operation of the PV system. The voltage drop, which is measured, is proportional to the partial current I.1-I.n. Other measurement methods for measuring the level of the current can likewise be used, for example methods for current measurement by means of Hall sensors.

The devices 12.1, 12.2-12.*n* for arc detection, referred to below as arc detectors 12.1-12.*n*, are configured to detect an AC component of the respective partial current I.1-I.n, which AC component is characteristic of the presence of an arc. In this case, in each case one AC voltage amplitude value $U_{AC}.1$-$U_{AC}.n$, which is determined within an emission frequency range which is characteristic of an arc, can be output as measurement value. The measurement value can in this case be output in a manner amplified and possibly smoothed in analog or digital form. In the text which follows, the AC voltage amplitude value is referred to as noise level $U_{AC}.1$-$U_{AC}.n$ since it is usually determined over a wide frequency range. In principle, however, arc detection could also be performed at a single measurement frequency or at a plurality of discrete measurement frequencies. The greater a measured noise level $U_{AC}.i$ is, where i=1 to n, the greater the probability that there is an arc in the corresponding PV subgenerator 2.*i*. Clear localization is, however, not possible under certain circumstances owing to crosstalk of the signal emitted by the arc to adjacent PV subgenerators e.g. via an inductive and/or capacitive coupling between said adjacent PV subgenerators.

The respective PV subgenerator 2.1-2.*n* can be decoupled from the DC input of the inverter 5 or connected thereto via the switching elements 13.1-13.*n*. The respective switching element 13.1-13.*n* can be an electromechanical switch, for example a set of contacts of a contactor or a relay. In one embodiment, the electromechanical switch comprises an arc quenching circuit. The respective switching element 13.1-13.*n* can also be a semiconductor switch, for example an IGBT (insulated-gate bipolar transistor) or a MOSFET (metal-oxide semiconductor field-effect transistor). Possibly, in this case diodes are associated with the semiconductor switches in order to prevent reverse currents. It is possible to use two transistors in a back-to-back configuration (i. e. connected in series but oriented antiparallel to each other) or, alternatively, a transistor connected to a rectifier in order to implement a bidirectionally operating semiconductor switch. A combination of an electromechanical switch and a semiconductor switch is also conceivable, wherein the semiconductor switch bypasses the electromechanical switch during its actuation in order to prevent the occurrence of an arc at the electromechanical switch. For reasons of brevity, the switching elements 13.1-13.*n* are referred to below as switches 13.1-13.*n*.

The monitoring units 10.1-10.*n* are connected to a central control device 15 via control lines 14. The control lines 14 are firstly used to transmit information detected within the monitoring units 10.1-10.*n* to the control device 15 and secondly to transmit control commands from the control device 15 to the monitoring units 10.1-10.*n*. The exchange of information can be performed virtually continuously at regular time intervals or can be initiated by the control device 15 and/or the monitoring units 10.1-10.*n*. Transmitted information and commands relate to the measurement values output by the current measurement arrangements 11.1-11.*n* and the arc detectors 12.1-12.*n* and actuation of the switches 13.1-13.*n*.

Provision can additionally be made for a dedicated control device to be arranged within each of the monitoring units 10.1-10.*n* in addition to and/or as an alternative to the central control device 15, for example for evaluating the measurement values output by the respective current measurement arrangement 11.1-11.*n* and/or the respective arc detector 12.1-12.*n* and/or for actuating the respective switch 13.1-13.*n*.

In this case, the control lines 14 are in the form of a network link. Alternatively, however, it is also conceivable for individual control lines to be implemented between the monitoring units 10.1-10.*n* and the control device 15. Alternatively, it is also conceivable for the transmission of the measurement values or signals between the control unit 15 and the monitoring units 10.1-10.*n* to take place wirelessly, for example in a manner exchanged by radio.

A method for quickly quenching and localizing a known arc in a PV generator is illustrated below using a flow chart in FIG. 2. The method can be implemented, for example, within the PV system shown in FIG. 1. Therefore, it is explained by way of example with reference to FIG. 1 using the reference symbols from FIG. 1.

It is assumed that the PV system 1 is in a normal operating state at the beginning of the method, in which normal operating state all of the switches 13.1-13.*n* are closed, with the result that all of the PV subgenerators 2.1-2.*n* are connected to the inverter 5.

At S 21 of the method, the arc detectors 12.1-12.*n* of the PV system 1 are activated. At S 22, an inquiry is made as to whether an arc is identified in one of the PV subgenerators 2.1-2.*n*. For this purpose, the noise levels $U_{AC}.1$-$U_{AC}.n$ measured by the arc detectors 12.1-12.*n* are compared in each case with a threshold value by the control device 15, for example. If at least one of the noise levels $U_{AC}.1$-$U_{AC}.n$ exceeds the threshold value, an arc counts as having been identified. (YES at S 22). Such a comparison can also be performed within the arc detectors 12.1-12.*n*, wherein, upon identification of an arc, a corresponding signal is output to the control device 15. Alternatively, provision can also be made for the noise levels $U_{AC}.1$-$U_{AC}.n$ to be added together and compared with a threshold value for the total value. S 22 is repeated until an arc is detected. When an arc has been detected, the method is continued at S 23.

At S 23, the noise levels $U_{AC}.1$-$U_{AC}.n$ are detected by the central unit 15 or transmitted to said central unit 15 by the arc detectors if this has not already been done at S 22.

In a subsequent act S 24, the noise levels $U_{AC}.1$-$U_{AC}.n$ are compared with one another in terms of their magnitude and are sorted. For this purpose, for example, a field variable of the sequence R.1 to R.n is defined, wherein the index (1, 2, . . . , n) of the largest noise level $U_{AC}.1$-$U_{AC}.n$ is stored in the field R.1. The index of the second largest noise level $U_{AC}.1$-$U_{AC}.n$ is stored in the field R.2, and so on, until, finally, the index of the smallest noise level $U_{AC}.1$-$U_{AC}.n$ is stored in the field R.n. Then, at S 24, a count variable i is set to the value zero.

In a subsequent act S 25, first the count variable i is incremented by one and then has the value i=1 in the first pass. Then, a further index variable j is set to the value R.i. The index variable j is therefore set to the index of the largest noise level R.1 in the first pass. Then, the switch 13.*j*, i.e. in the first pass the switch associated with the PV subgenerator 2.*j* in which the largest noise level R.1 was measured, is opened and therefore this PV subgenerator 2.*j* is decoupled from the inverter 5, whereas the rest of the PV subgenerators remain connected to the inverter 5, as before.

In a subsequent act S 26, in a manner similar to that at S 22, an inquiry is made as to whether an arc is still detected in the DC circuit. If an arc is no longer identified (NO at S 26), it can be assumed that a previously existing arc identified at S 22 has been quenched by the PV subgenerator 2.j being decoupled from the DC circuit. In this case, the method branches to S 27, in which signaling is performed to indicate that an arc has been identified in the PV subgenerator 2.j. If appropriate, it may be expedient or necessary to galvanically isolate the PV subgenerator 2.j in which the arc has been localized and quenched from the inverter 5 permanently, but at least for the duration of necessary repair and maintenance work. Under certain boundary conditions, galvanic isolation at all poles of the affected PV subgenerator 2.j may also be required. It can therefore be necessary to possibly provide further switching units within the DC lines 3.1-3.n, for example also on the cathode side of the individual PV subgenerators 2.1-2.n. However, these further switching units are not illustrated in FIG. 1 for reasons of clarity.

In the illustrated form of the PV system 1 and the method it is possible to localize a series arc and to signal this at S 27. A series arc is an arc which occurs in series with the current source, i.e. in this case in series with one of the PV subgenerators 2.1-2.n. This should be distinguished from a parallel arc, which forms in a parallel circuit with the current source, i.e. in parallel with one of the PV subgenerators 2.1-2.n (or some of said PV subgenerators).

Since an arc in parallel with one the PV subgenerators 2.1-2.n would not be quenched by the corresponding PV subgenerator 2.1-2.n being isolated by the switching unit 10.1-10.n, such a parallel arc cannot be localized by the arrangement illustrated. When using switching units which are arranged in such a way that they can selectively short-circuit the PV subgenerators 2.1-2.n, the method described here can also be used for localizing parallel arcs, however. Corresponding switching units 16.1-16.n are, for example, semiconductor switches which can be switched individually and independently of one another by the control device 15 via further control lines 17. In this case, diodes are possibly associated with the semiconductor switches in order to prevent reverse currents. It is also conceivable for in each case one electromechanical switch (not illustrated) to be connected in parallel with the semiconductor switches, which electromechanical switch closes in the case of actuation of a semiconductor switch likewise with a slight time delay with respect to this semiconductor switch. As a result, a power loss which would otherwise occur across a closed semiconductor switch and therefore the thermal loading on the semiconductor switch can be significantly reduced. This variant is particularly advantageous for a longer-term short circuit of a PV subgenerator 2.1-2.n. For reasons of clarity, only one of these switching units, namely the switching unit 16.1, in connection with the PV subgenerator 2.1 is illustrated by way of example in FIG. 1. In this case, the separate control lines 17 are only illustrated by way of example. Alternatively, actuation of the switching units 16.1-16.n with the aid of signal transmission on already existing lines (PLC-power line communication) or with the aid of wireless signal transmission (radio technology) is also possible.

In an alternative embodiment of the system shown in FIG. 1, the switching units 16.1-16.n are connecting the current paths 3.1-3.n to the DC-line 4 in a different way compared to FIG. 1. In said alternative embodiment, the connection point of the switching units 16.i (i=1 to n) to the different current paths 3.i (i=1 to n) are in each case located between the arc detector 12.i and the switching element 13.i associated with the relevant PV-subgenerator 2.i. In addition, a capacitor (not shown in FIG. 1) is connected between both terminals of each switching unit 16.i (i=1 to n) in order to provide a bypass path for AC-current signals with frequencies that are characteristic for arcs. That way, the AC.current signals are also transmitted if the relevant switching unit 16.i is not closed.

In this embodiment it is ensured that for each PV-subgenerator 2.1-2.n arc typical AC-currents, which are generated via crosstalk with another PV-subgenerator, can flow within the respective PV-subgenerator 2.i even in a situation in which an open switching element 13.i is present in said PV-subgenerator 2.i. Using said alternative embodiment it is also possible to distinguish between an AC-current signal that is generated in a PV-subgenerator via crosstalk—e.g. from an arc located in another PV-subgenerator—and an AC-signal generated from an arc located in the respective PV-subgenerator.

In order to be able to localize and quench both types of arcs (series arcs and parallel arcs) in the method, a further act can optionally be implemented between acts S 25 and S 26. In this further act, the switching unit 16.j, i.e. in the first pass the switching unit which is connected in parallel with the PV subgenerator 2.j in which the largest noise level R.1 was measured, is closed. The remaining switching units 16.1-16.n (without 16.j) remain open, as before. Therefore, the PV subgenerator 2.j which was already decoupled selectively from the inverter 5 at S 25 is now also selectively short-circuited, whereas the remaining PV subgenerators 2.1-2.n (without 2.j) continue to be connected to the inverter 5 and to be live. Thus, a parallel arc which may be present in the PV subgenerator 2.j is now quenched as well.

If an arc is still detected at S 26, the method is continued at S 28, in which the switch 13.j is closed again. Now the possibly previously closed switching unit 16.j is also opened again, if appropriate. The corresponding PV subgenerator 2.j is thus live again and is again connected to the inverter 5.

In a subsequent act S 29, an inquiry is performed to ascertain whether the counter variable i has already reached the value n of the number of present PV subgenerators 2.1-2.n. If the counter variable i has not yet reached the value of the number n, the method branches back to S 25. At S 25, the counter variable is first incremented, i.e. set to the value i=2 and j=R.2, for example. Then the remaining part of act S 25 and act S 26 and possibly S 27 or S 28, S 29 are repeated in respect of the PV subgenerator 2.j which has the second highest noise level $U_{AC}.j$ in the arc detection.

The noise level or the amplified and possibly smoothed measurement value of the noise level indicates the probability with which the observed arc is present in the corresponding PV subgenerator. In the indicated method, localization of the arc by means of attempted quenching in the sequence of decreasing noise levels, i.e. in the sequence of decreasing probability of the presence of the arc, takes place. In this way, an arc with a high probability is localized in one of the first passes of acts S 25 to S 29 and is therefore quenched as quickly as possible.

If it is established at S 29 that the counter variable i has already reached the value of the number n, the method is continued at S 30.

The method can only reach this act S 30 when the arc could not be quenched and therefore localized in any of the PV subgenerators 2.1-2.n. There may be a number of reasons for this. For example, an interference signal may erroneously have been considered to be an arc. Such an interference signal may have been coupled into the PV system 1 by an external interference transmitter, for example. Provision can now be made for parameters of the arc detection by the arc detectors 12.1-12.n for arc detection to be modified, at S 30, in order to become insensitive to the interference signal. For example, provision can be made for the frequency range in which the noise levels $U_{AC}.1$-$U_{AC}.n$ are determined to be shifted or reduced in size. The method is then continued, at S 21, with the newly determined parameters for the arc detection from the start. In an alternative configuration of the method, it is also conceivable for disconnection of the PV system 1 to be performed at S 30, if appropriate with simultaneous short-circuiting of the DC input of the inverter 5 for quenching a possible parallel arc.

Figure 2:
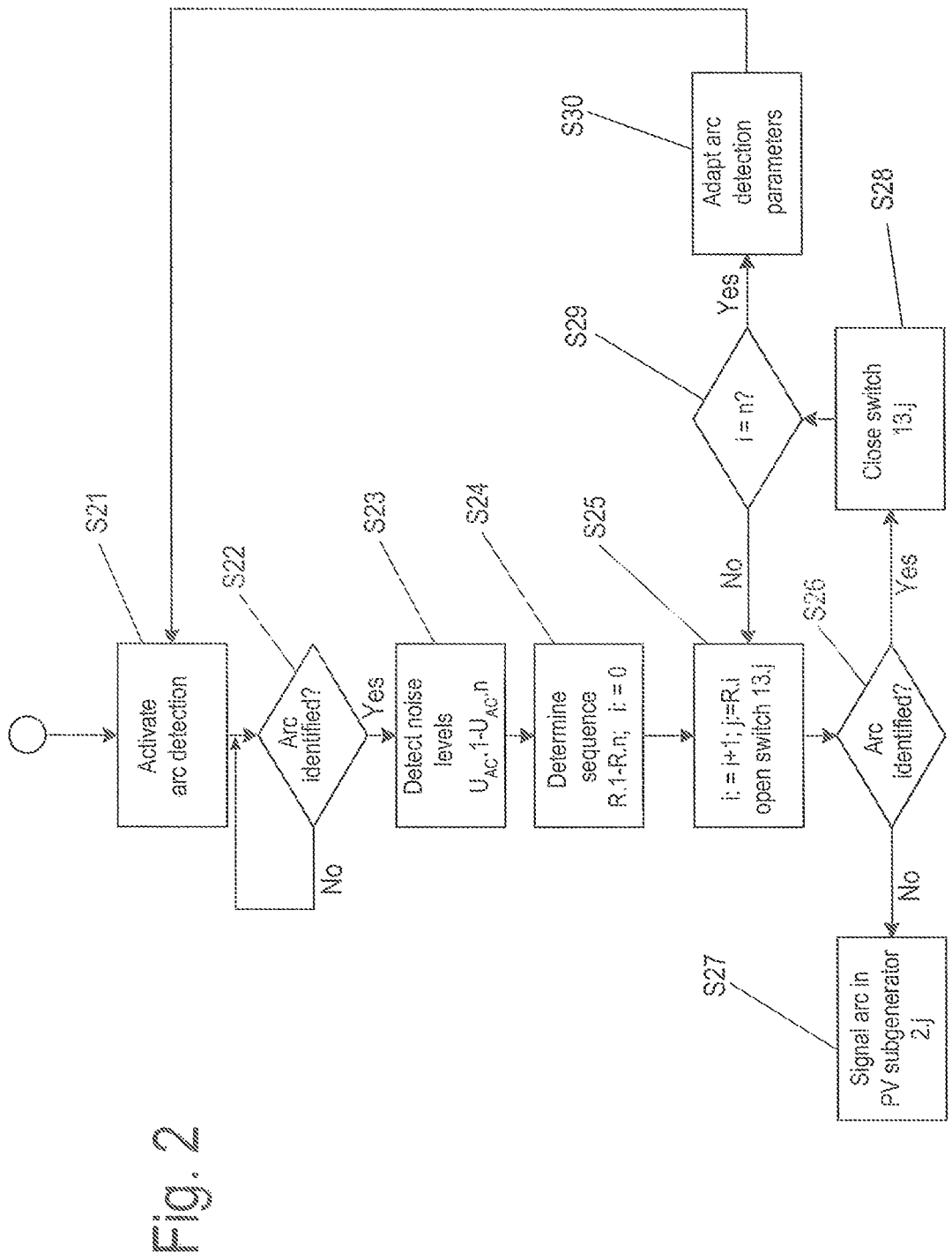
FIG. 2 shows a flow chart of a method for quenching and localizing an arc.

In an alternative configuration of the PV system 1 shown in FIG. 1 and also of the method shown in FIG. 2, evaluation of the measurement values of the current measurement arrangement 11.1-11.n and of the arc detectors 12.1-12.n is not performed within the central control device 15, but decentrally in individual control devices, which are provided in the monitoring units 10.1-10.n. By exchanging the measured noise levels $U_{AC}.1$-$U_{AC}.n$, the sequence R.1-R.n can also be established without a table being managed in the central control device 15. Depending on the determined sequence, the monitoring units 10.1-10.n coordinate with one another with respect to the disconnection of corresponding PV subgenerators 2.1-2.n in the order of the determined sequence until an arc has been localized in one of the PV subgenerators 2.1-2.n or all of the switches 13.1-13.n have been actuated successively. It is also conceivable for actuation of the switches 13.1-13.n and of the further switching units 16.1-16.n to be performed within the or by the monitoring units 10.1-10.n. In this case, the method can possibly also be implemented without a central control unit 15 since the monitoring units 10.1-10.n can communicate the measured noise levels $U_{AC}.1$-$U_{AC}.n$, as well as the sequence R.1-R.n derived therefrom, amongst one another. In an alternative configuration of the method, in acts S 23 and S 24, further probability indicators for the presence of an arc in one of the PV subgenerators 2.1-2.n can be used as an alternative and/or in addition to the noise levels $U_{AC}.1$-$U_{AC}.n$ for establishing the sequence R.1-R.n.

The occurrence of an arc in one of the PV subgenerators 2.i (where i=1 . . . n) is generally accompanied by a change, correlated therewith, in the partial current I.i through the corresponding PV subgenerator 2.i. Such a change may be either a reduction (generally a characteristic feature of series arcs) or a rise in the partial current I.i (generally a characteristic feature of parallel arcs). Essential here is in particular a temporal correlation of the change in the partial currents I.i with the occurrence or disappearance of a broadband noise characteristic of arcs. This temporal correlation can be used in particular also for implementation of a plausibility check within the arc detection. If, for example, a temporal correlation between the change in at least one partial current I.1-I.n and the change (occurrence or disappearance) in at least one detected noise level $U_{AC}.1$-$U_{AC}.n$ is present, the noise level can be attributed with a high degree of probability to an arc. If, however, there is no temporal correlation between the changes in at least one partial current I.1-I.n and a noise level $U_{AC}.1$-$U_{AC}.n$, it is probable that the at least one noise level $U_{AC}.1$-$U_{AC}.n$ has been produced by external interference and in particular cannot be attributed to an arc. If there is a temporal correlation between the changes in the noise levels $U_{AC}.1$-$U_{AC}.n$ and the partial currents, a further probability can be determined via the change amplitudes of the individual partial currents I.1-I.n, with this further probability reflecting the localization of an arc in the individual PV subgenerators 2.1-2.n.

Within the method according to FIG. 2, the change in the partial currents I.1-I.n can be taken into consideration as follows, for example. Once an arc has been identified by one of the arc detectors 12.1-12.n at S 22, a check can then be performed to ascertain whether, temporally correlated therewith, one of the partial currents I.1-I.n has been reduced. This information can be used in the establishment of the sequence R.1-R.n. In this case, a weighting can be effected, in accordance with which the indicators of noise levels and current change in the partial currents I.1-I.n for establishing the sequence R.1-R.n are rated. Since an arc can be identified by the arc detectors 12.1-12.n only after a certain delay time, provision is made in an advantageous configuration for storing measurement values for the partial currents I.1-I.n for a time period in the past with a length which at least corresponds to the duration of the arc detection. This can be performed, for example, by the measurement values for the partial currents I.1-I.n being written to circular buffers. Said circular buffers can be arranged in each case within the monitoring units 10.1-10.n or within the control device 15.

If the switching units 13.1-13.n comprise a parallel circuit comprising an electromechanical switch and a semiconductor switch, the time taken to discover an arc using a special speed-optimized switching sequence can be further reduced. In this case, the switches 13.1-13.n are actuated in the form that time-consuming switching of the electromechancal switches is largely reduced and if possible moved to switching operations of the semiconductor switches connected in parallel. For example, for this purpose, first the semiconductor switches which are associated with a closed electromechanical switch are closed. The switching state of the electromechanical switches is thus transferred to the associated semiconductor switches. Then, the relevant electromechanical switches are opened, wherein this opening takes place owing to the bridging of the switching contacts by the closed semiconductor switches arranged in parallel without a switching arc between the contacts. Then, the semiconductor switches can subsequently be opened quickly in succession for localizing the previously identified arc, wherein the sequence in accordance with the above-described method according to the application is established on the basis of the probability with which the arc is located in the corresponding PV subgenerator.

The invention claimed is:

1. A method for localizing and quenching an arc in a photovoltaic (PV) generator of a PV system, wherein the PV generator comprises at least two PV subgenerators, and wherein an arc quenching circuit is associated with each PV subgenerator, said method comprising:
   detecting an arc in the PV generator;
   determining a probability value for each of the PV subgenerators which is correlated with a probability that the arc is located in the corresponding PV subgenerator;
   determining a sequence for activating the arc quenching circuits associated with the PV subgenerators based on the determined probability values; and
   successively activating the arc quenching circuits in the order of the determined sequence.

2. The method as claimed in claim 1, wherein the probability values are determined based on noise levels of AC voltage signals in the PV subgenerators.

3. The method as claimed in claim 2, wherein the arc quenching circuits are activated in the sequence of decreasing noise levels.

4. The method as claimed in claim 1, wherein the probability values are determined from changes in measured partial currents flowing through the PV subgenerators.

5. The method as claimed in claim 4, wherein measured values for the partial currents are stored continuously, and wherein the probability values are determined based on the measured values for the partial currents which have been measured during the occurrence of the arc.

6. The method as claimed in claim 1, wherein the probability values are determined based on noise levels of AC voltage signals in the PV subgenerators, and based on changes in measured values of partial currents flowing through the PV subgenerators.

7. The method as claimed in claim 6, further comprising:
performing a check to ascertain whether the change in the partial currents correlates temporally with a change in the noise levels; and
implementing a plausibility check with respect to the probability of an arc in the PV subgenerator depending on the check.

8. The method as claimed in claim 1, further comprising: interrupting a partial current through the corresponding PV subgenerator upon activating the corresponding arc quenching circuit.

9. The method as claimed in claim 1, further comprising short-circuiting the corresponding PV subgenerator upon activating the corresponding arc quenching circuit.

10. The method as claimed in claim 8, wherein, in order to interrupt the partial current through the corresponding PV subgenerator, in each case one switching element, each comprising an electromechanical switch and a semiconductor switch arranged in parallel therewith, is provided, and wherein the interruption of the partial current through the corresponding PV subgenerator comprises switching of the respective semiconductor switch of the switching element after all of the electromechanical switches of the switching elements have been opened.

11. The method as claimed in claim 1, further comprising signalling an arc as having been localized in a PV subgenerator if, after activation of the arc quenching circuit which is associated with this PV subgenerator, an arc is no longer detected in the PV generator.

12. An apparatus for localizing and quenching an arc in a photovoltaic (PV) generator of a PV system, wherein the PV generator comprises at least two PV subgenerators, comprising:
an arc quenching circuit associated with each PV subgenerator;
an arc detection device associated with each PV subgenerator; and
a control device per PV subgenerator or a central control device for the entire PV system, wherein each control device or the central control device is configured:
to determine a probability value for each of the PV subgenerators, wherein the probability value is correlated with a probability that an arc is located in the corresponding PV subgenerator;
to determine a sequence for activating the arc quenching circuits depending on the determined probability values; and
to successively activate the arc quenching circuits in the order of the determined sequence.

13. An apparatus for quenching an arc in a photovoltaic (PV) system, comprising:
a plurality of monitoring circuits, each respectively associated with a PV subgenerator of the PV system, wherein each of the monitoring circuits is configured to provide an indication signal that is indicative of a presence of an arc in the respective PV subgenerator; and
a control circuit configured to receive the indication signal from each of the plurality of monitoring circuits, and further configured to generate a plurality of control signals to the plurality of monitoring circuits in response thereto, wherein the plurality of control signals dictate a sequence for activating arc quenching circuits associated with the monitoring circuits of the respective PV subgenerators, and wherein the sequence is based on a determined probability value for each PV subgenerator that correlates with a probability that an arc is located in the corresponding PV subgenerator.

14. The apparatus of claim 13, wherein each of the plurality of monitoring units comprises a current measurement device configured to detect an AC component of a partial current associated with its respective PV subgenerator, wherein the AC component comprises a characteristic indicative of a presence of an arc.

15. The apparatus of claim 14, wherein the AC component of a partial current is converted by the monitoring unit to an AC voltage component that comprises a noise level associated with the respective PV subgenerator.

16. The apparatus of claim 14, wherein the control circuit is configured to receive the AC component of a partial current or a signal associated therewith as the indication signal, compare the indication signal to a threshold, and draw a conclusion regarding presence of an arc based on a result of the comparison.

17. The apparatus of claim 14, wherein the control circuit is configured to receive the AC component of a partial current or a signal associated therewith as values of each monitoring unit and sort the values in terms of their magnitude to form a sorted sequence, and wherein the sorted sequence is employed to generate the activating sequence by the control circuit.

18. The apparatus of claim 14, wherein the current measurement device of each of the plurality of monitoring units is further configured to detect changes in partial currents flowing through the respective PV subgenerators, and wherein probability values associated with an occurrence of an arc are associated with the detected changes in partial currents and the AC component of the partial currents.

19. The apparatus of claim 13, wherein each of the plurality of monitoring units comprises a current measurement device configured to detect changes in partial currents flowing through the respective PV subgenerators, and wherein probability values associated with an occurrence of an arc are associated with the detected changes in partial currents.

* * * * *